(12) United States Patent
Host et al.

(10) Patent No.: US 10,775,963 B2
(45) Date of Patent: Sep. 15, 2020

(54) SIMULATION ENVIRONMENT

(71) Applicant: The Boeing Company, Chicago, IL (US)

(72) Inventors: Christian Thorkil Host, Wallingford, PA (US); Michael Christopher Freebery, Hockessin, DE (US); George Joseph Werbos, Spring City, PA (US)

(73) Assignee: The Boeing Company, Chicago, IL (US)

( * ) Notice: Subject to any disclaimer, the term of this patent is extended or adjusted under 35 U.S.C. 154(b) by 909 days.

(21) Appl. No.: 14/950,614

(22) Filed: Nov. 24, 2015

(65) Prior Publication Data

US 2017/0147162 A1  May 25, 2017

(51) Int. Cl.

| | | |
|---|---|---|
| *G06F 30/20* | (2020.01) | |
| *G06F 3/0482* | (2013.01) | |
| *G06F 3/0484* | (2013.01) | |
| *G08G 5/00* | (2006.01) | |
| *G06F 3/0481* | (2013.01) | |
| *G06F 3/0488* | (2013.01) | |
| *G06Q 10/06* | (2012.01) | |
| *G06Q 50/26* | (2012.01) | |
| *G06F 16/29* | (2019.01) | |
| *G06F 30/15* | (2020.01) | |

(52) U.S. Cl.
CPC .......... *G06F 3/0482* (2013.01); *G06F 3/0484* (2013.01); *G06F 3/04817* (2013.01); *G06F 3/04845* (2013.01); *G06F 3/04883* (2013.01); *G06F 16/29* (2019.01); *G06F 30/20* (2020.01); *G06Q 10/06313* (2013.01); *G06Q 50/26* (2013.01); *G06F 30/15* (2020.01); *G06F 2203/04804* (2013.01); *G08G 5/0034* (2013.01)

(58) Field of Classification Search
CPC ..................................................... G06F 3/0482
USPC ......................................................... 715/771
See application file for complete search history.

(56) References Cited

U.S. PATENT DOCUMENTS

| | | | | |
|---|---|---|---|---|
| 9,501,058 | B1 * | 11/2016 | Mariet | B60T 7/22 |
| 2008/0167811 | A1 * | 7/2008 | Geelen | G01C 21/3655 |
| | | | | 701/455 |
| 2008/0312826 | A1 * | 12/2008 | Shahrestani | G01C 21/3611 |
| | | | | 701/533 |

(Continued)

OTHER PUBLICATIONS

"Systems Tool Kit (STK)," Analytical Graphics, Inc (AGI), copyright 2015, 2 pages, accessed Nov. 19, 2015. http://www.agi.com/products/stk/.

(Continued)

*Primary Examiner* — Li P Sun
(74) *Attorney, Agent, or Firm* — Yee & Associates, P.C.

(57) ABSTRACT

A method and apparatus for performing a simulation are provided. An electronic map is displayed on a computer screen. Interactive features of a graphical user interface are superimposed over the electronic map, wherein the graphical user interface is controlled by a first entity, and the electronic map is controlled by a second entity. Input associated with a mission is received. An icon of a transportation entity for the mission is displayed on the electronic map based on the input. The icon of the transportation entity is automatically moved in simulation as a function of time, by a processor, based on the input and properties of the icon of the transportation entity.

19 Claims, 12 Drawing Sheets

(56) References Cited

U.S. PATENT DOCUMENTS

2010/0003652 A1* 1/2010 Lavie .................... G06Q 10/10
            434/219
2013/0110739 A1* 5/2013 Hill ...................... G06Q 10/083
            705/333
2014/0052664 A1* 2/2014 Toffa ................... G09B 29/106
            705/347

OTHER PUBLICATIONS

"World of Warships—Game—About," Wargaming.net, copyright 2012-2015, 5 pages, accessed Nov. 19, 2015. http://worldofwarships.com/en/content/game/.

* cited by examiner

SIMULATION ENVIRONMENT

BACKGROUND INFORMATION

1. Field

The present disclosure relates generally to creating simulations. In particular, the present disclosure relates to a method and apparatus for generating instantaneous simulations of transportation entities.

2. Background

Map exercises may be training exercises that portray military situations. These training exercises may traditionally be performed on physical maps or a sand table. Map exercises may include physical simulations of movement of transportation entities such as ground, air, or water vehicles. Map exercises may also include physical simulations of transporting physical assets such as cargo, fuel, or troops.

Currently, simulations of transportation entities may be performed electronically. Electronic simulations may have advantages over physical simulations. However, generating electronic simulations may be more complicated or costly than desirable. For example, proprietary maps may be offered for purchase. However, implementing simulations may be more difficult than desirable using purchasable proprietary maps. Further, the cost of purchasable proprietary maps may be greater than desired.

As another example, maps may be independently developed by a company for the company's use. However, generating maps by a company may take multiple months of programming. Further, it may take multiple programmers to create a map. As a result, development of maps by a company may be at least one of more time-consuming or more costly than desired.

Therefore, it would be desirable to have a method and apparatus that take into account at least some of the issues discussed above, as well as possibly other issues. For example, it would be desirable to perform electronic simulations without the use of purchasable proprietary maps. Further, it would be desirable to perform electronic simulations without generating maps specifically for the simulation.

SUMMARY

In one illustrative embodiment, a computer-implemented method is provided. An electronic map is displayed on a computer screen. Interactive features of a graphical user interface are superimposed over the electronic map, wherein the graphical user interface is controlled by a first entity, and the electronic map is controlled by a second entity. Input associated with a mission is received. An icon of a transportation entity for the mission is displayed on the electronic map based on the input. The icon of the transportation entity is automatically moved in simulation as a function of time, by a processor, based on the input and properties of the icon of the transportation entity.

A further illustrative embodiment of the present disclosure provides a method for creating an instantaneous simulation. A graphical user interface is displayed by a computer system over an electronic map on a display system, wherein the graphical user interface is controlled by a first entity, and the electronic map is controlled by a second entity. A first input identifying a transportation entity is received by the computer system. A first icon for the transportation entity is displayed by the computer system on the electronic map. A second input identifying a route is received by the computer system. The instantaneous simulation is run by the computer system, wherein running the instantaneous simulation includes automatically moving the first icon along the route, by the computer system, based on properties of the first icon, wherein the properties include a speed of the first icon.

A yet further illustrative embodiment provides a method for creating and performing a simulation. Interactive features of a graphical user interface are displayed over an electronic map on a computer screen, wherein the graphical user interface is controlled by a first entity, and the electronic map is controlled by a second entity. A first input identifying a number of transportation entities is received using the interactive features. A number of icons for the number of transportation entities is displayed on the electronic map. A second input identifying a number of routes is received on the electronic map. A third input identifying a number of payloads is received using the interactive features, wherein the number of transportation entities, the number of routes, and the number of payloads form the simulation. The number of icons is automatically moved along the number of routes, by a processor, based on properties of the number of icons to perform the simulation, wherein the properties include a respective speed for each icon in the number of icons, and wherein moving the number of icons along the number of routes includes determining a series of locations on the number of routes based on the respective speed for each icon of the number of icons, wherein each of the series of locations is present on a respective route of the number of routes, and wherein each of the series of locations is represented using a latitude, a longitude, and a time.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and features thereof will best be understood by reference to the following detailed description of an illustrative embodiment of the present disclosure when read in conjunction with the accompanying drawings, wherein:

DETAILED DESCRIPTION

Figure 1:
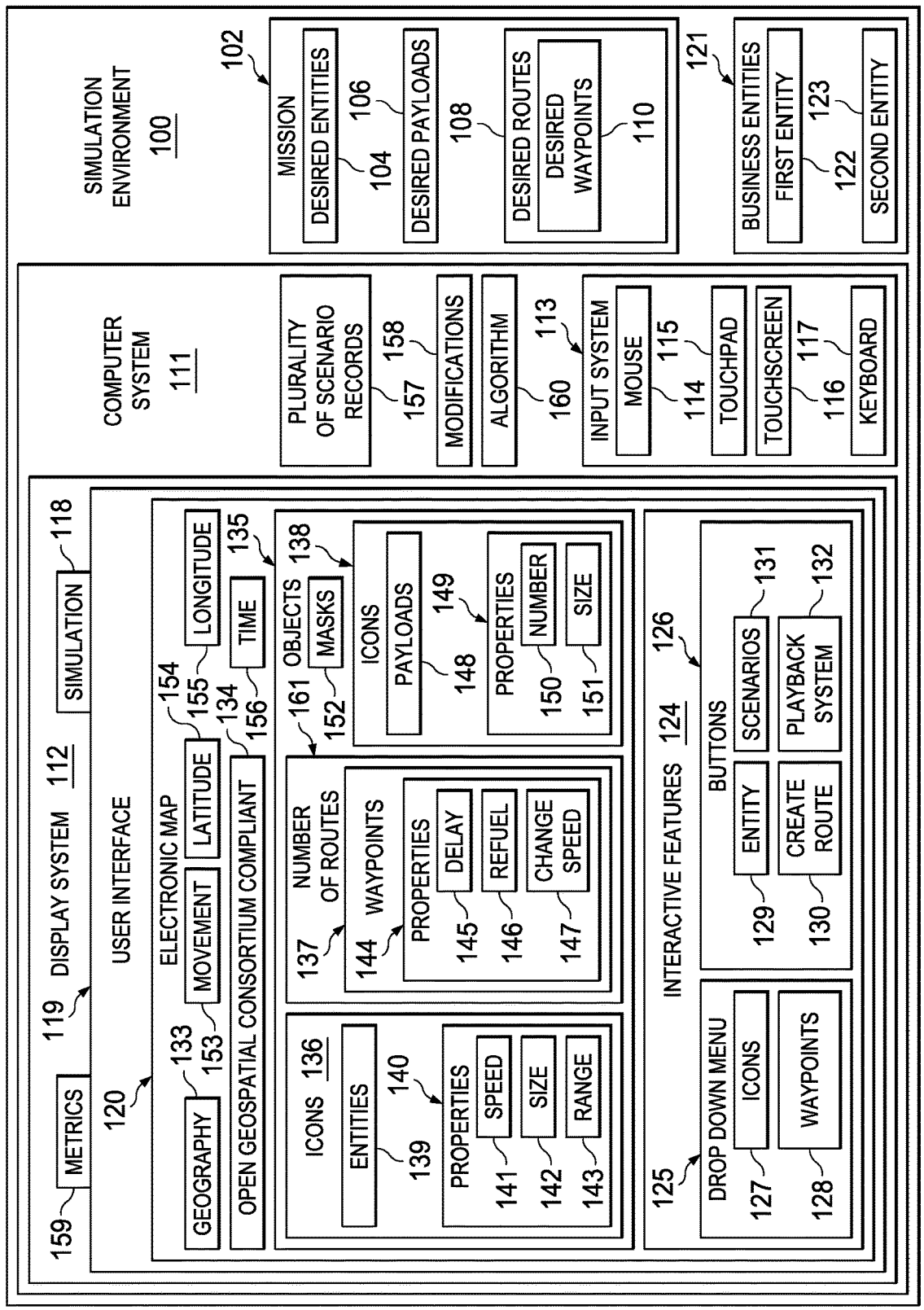
FIG. 1 is an illustration of a block diagram of a simulation environment in accordance with an illustrative embodiment.

With reference to FIG. 1, an illustration of a block diagram of a simulation environment is depicted in accordance with an illustrative embodiment. In this illustrative example, simulation environment 100 may be used to perform electronic map exercises. Simulation environment 100 may provide the ability to perform electronic map exercises with at least one of a lower cost or a lower time investment than conventional purchasable proprietary maps or programming company specific maps.

Simulation environment 100 may be used to perform electronic map exercises for mission 102. Mission 102 may include desired entities 104, desired payloads 106, and desired routes 108. Desired entities 104 may include desired transportation entities, such as any desirable vehicle. Desired entities 104 may include at least one of air vehicles, land vehicles, or water vehicles.

As used herein, the phrase "at least one of," when used with a list of items, means different combinations of one or more of the listed items may be used, and only one of each item in the list may be needed. In other words, "at least one of" means any combination of items and number of items may be used from the list, but not all of the items in the list are required. The item may be a particular object, thing, or a category.

For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations.

Desired payloads 106 may include any desirable assets for movement in mission 102. In some illustrative examples, desired payloads 106 may include at least one of cargo, fuel, or troops. In some illustrative examples, desired payloads 106 may include any desirable aid supplies such as food, water, medications, or other aid supplies. In one example, desired payloads 106 may include civilian passengers.

Desired routes 108 may be designated by desired waypoints 110. Desired waypoints 110 may include a number of cities, military bases, or other locations along desired routes 108. As used herein, a "number of," when used with reference to items, means one or more items. For example, a number of cities includes one or more cities. Desired waypoints 110 may include locations for stopping, landing, refueling, changing speeds, dropping off a payload, picking up a payload, or any other desirable action.

Simulation environment 100 includes computer system 111. Computer system 111 is a hardware system that includes one or more data processing systems. When more than one data processing system is present, those data processing systems may be in communication with each other using a communications medium. The communications medium may be a network. The data processing systems may be selected from at least one of a computer, a server computer, a workstation, a tablet computer, a laptop computer, a mobile phone, or some other suitable data processing system.

Computer system 111 includes display system 112 and input system 113. Display system 112 is configured to display information to a user. Display system 112 may comprise, for example, without limitation, a monitor, a touch screen, a laser display, a holographic display, a virtual display device, and/or some other type of display device. Input system 113 may be configured to receive user input. Input system 113 may include at least one of mouse 114, touchpad 115, touchscreen 116, or keyboard 117.

Input for simulation 118 may be received through input system 113. Simulation 118 may be displayed on display system 112.

User interface 119 and electronic map 120 are displayed on display system 112. User interface 119 is superimposed over electronic map 120. User interface 119 and electronic map 120 may be controlled by different entities of business entities 121. For example, user interface 119 may be controlled by first entity 122, while electronic map 120 is controlled by second entity 123.

In some examples, first entity 122 may be a business or company desiring to perform simulation 118. In other examples, first entity 122 may be a business or a company that manufactures or sells entities of desired entities 104 of mission 102.

In some examples, second entity 123 may be a company directed to providing and managing information to the public using electronic map 120. Electronic map 120 may not be capable of performing simulation 118 without user interface 119. For example, electronic map 120 may instead be primarily used as a map for providing driving directions from a first location to a second location.

User interface 119 includes interactive features 124. Interactive features 124 may provide options for simulation 118. Interactive features 124 include at least one of drop down menu 125 or buttons 126. Drop down menu 125 may be used to select from a variety of options. Drop down menu 125 may allow for selection from icons 127. Icons 127 may represent options for transportation entities. Icons 127 may be displayed in an array.

Drop down menu 125 may allow for selection from waypoints 128. Selecting from waypoints 128 may form a route on electronic map 120. When drop down menu 125 includes waypoints 128, waypoints 128 may be displayed as a series of text entries in a column.

Interactive features 124 may include buttons 126. Buttons 126 may be used to switch between functionalities in user interface 119. For example, buttons 126 may include entity 129, create route 130, scenarios 131, and playback system 132. By selecting entity 129, drop down menu 125, including an array of icons 127, is displayed. In some examples, by toggling entity 129, an icon of icons 127 may be selected and then positioned on electronic map 120.

By toggling create route 130, waypoints 128 may be added on electronic map 120. Waypoints 128 may be added onto electronic map 120 until create route 130 is toggled again.

By toggling scenarios 131, previous simulations may be selected for playback. For example, by toggling scenarios 131, rather than adding input for mission 102, a previously created and saved simulation 118 for mission 102 may be selected. Simulation 118 may be saved in any desirable format. In some illustrative examples, simulation 118 may be saved as a standard KML 2.2 file. KML is a file format used to display geographic data. KML is maintained by Open Geospatial Consortium, Inc. KML uses a tag-based structure with nested elements and attributes. A KML 2.2 file may be readable in a Geospatial Consortium compliant geographic information system.

Playback system 132 may include a plurality of buttons. For example, playback system 132 may include at least one of a play button, a stop button, a first arrow button, and a second arrow button. The first arrow button and the second arrow button may control the speed of simulation 118. By using the first arrow button and the second arrow button, a custom speed may be created for simulation 118. As a result, simulation 118 is not limited to a default speed.

Electronic map 120 may provide geography 133. Geography 133 may be any desirable geography. For example, geography 133 may include portions of North America. In other examples, geography 133 may include Europe.

In some illustrative examples, electronic map 120 is a geographic information system that is Open Geospatial Consortium compliant 134. One commonly known example of Open Geospatial Consortium compliant 134 geographic information system may be Google Earth.

Objects 135 may be positioned on electronic map 120, based on input received through input system 113. Input may be received through user interface 119, as well as on electronic map 120. For example, an icon may be selected from icons 127 of user interface 119, but then placed on electronic map 120 by clicking on a desired location of electronic map 120.

Objects 135 may include at least one of icons 136, waypoints 137, or icons 138. Icons 136 may represent entities 139. Entities 139 may be transportation entities such as at least one of air vehicles, land vehicles, or water vehicles. Each icon of icons 136 has properties 140. Properties 140 may include at least one of speed 141, size 142, or range 143. Properties 140 may be specific to each icon of icons 136. In some illustrative examples, at least one property of properties 140 may be different for each icon of icons 136.

Speed 141 may reflect the traveling speed of the transportation entity in the physical world. For example, an icon of icons 136 may represent a selected airplane. The design of the selected airplane may have an average speed. If a different design of airplane was selected, the average speed may be different. Accordingly, speed 141 may be different for each icon of icons 136.

In some illustrative examples, size 142 may be the same for each icon of icons 136. In other illustrative examples, size 142 may reflect a relative size of the transportation entity in the physical world. For example, icons of icons 136 representing helicopters may be smaller than icons of icons 136 representing carrier airplanes.

In some illustrative examples, properties 140 may include range 143. Range 143 may represent a suggested range for a transportation entity of entities 139 in the physical world. For example, a range of a military transport truck may be related to the size of the gas tank and the fuel efficiency of the military transport truck. Range 143 may represent a range until refueling is suggested. Range 143 for each icon of icons 136 may be demonstrated on electronic map 120 by displaying a respective ring around each icon of icons 136. The radius of the ring may change depending on the scale of electronic map 120. The radius of each ring may be dependent on the range of the respective entity of entities 139.

Icons 136 may travel between waypoints 137. Waypoints 137 may also serve as locations for a number of actions to be taken.

Waypoints 137 may each be associated with a respective icon of icons 136. To create waypoints 137, create route 130 may be toggled. Specifically, create route 130 may be toggled while an icon of icons 136 is selected. All waypoints of waypoints 137 created while the icon is selected will be associated with that respective icon.

Properties 144 may represent the number of actions that may be taken. For example, properties 144 may include at least one of delay 145, refuel 146, or change speed 147. Each waypoint of waypoints 137 may have its own respective properties of properties 144.

Delay 145 may be a length of time an icon of icons 136 may stay at a selected waypoint of waypoints 137. For example, an icon may stay at a selected waypoint of waypoints 137 to pick up or drop off a payload. During delay 145, the selected icon of icons 136 is stationary at a waypoint of waypoints 137.

Refuel 146 may be a length of time for an entity of entities 139 to receive fuel. Refuel 146 may be a length of time an icon of icons 136 is stationary at a respective waypoint of waypoints 137.

Change speed 147 may be associated with a waypoint of waypoints 137 at which an icon of icons 136 changes speed. For example, an icon of icons 136 representing a land vehicle may move at a first speed before reaching a respective waypoint of waypoints 137. The first speed may be selected based on at least one of speed limits, desired time of reaching the respective waypoint, fuel economy, or any other desirable factors. An icon of icons 136 may move at a second speed after reaching the respective waypoint of waypoints 137. The second speed may be higher or lower than the first speed. The second speed may be selected based on at least one of speed limits, desired time of reaching a subsequent waypoint, fuel economy, or any other desirable factors.

Icons 138 may represent payloads 148. Payloads 148 may be any desirable physical assets such as cargo, fuel, or troops. Payloads 148 may be created by selecting waypoints 137. For example, if a first payload of payloads 148 is desired to drop off at a first waypoint of waypoints 137, the first waypoint on electronic map 120 may be selected such that a pop-up menu is presented. The pop-up menu may allow for data related to at least one of a type of payload, a quantity of payload, whether the payload is "picked up" or "dropped off," or a time. For example, the first waypoint may be selected and data entered into the pop-up menu such that 5 troops are dropped off as a first payload of payloads 148.

Icons 138 have properties 149. Each icon of icons 138 may have its own respective properties of properties 149. Properties 149 may include number 150 and size 151. Size 151 may be a size of the respective icon of icons 138. Number 150 may be a quantity of a payload of a respective icon of icons 138. For example, if the respective payload of payloads 148 is a number of troops, number 150 may be the quantity of troops. As another example, if the respective payload of payloads 148 is cargo, number 150 may be a weight of the cargo or a count of the number of items in the cargo.

Icons 138 may be constantly present at the respective waypoints of waypoints 137. For example, if a first icon of icons 138 will be visible at a waypoint of waypoints 137 during simulation 118, the first icon will be present on electronic map 120 throughout simulation 118. However, the first icon may be concealed when the first icon should not be visible.

Masks 152 may be used during simulation 118 to conceal icons 138 when icons 138 should not be displayed. Masks 152 may have the same image as the portion of electronic map 120 that masks 152 cover. Concealing with masks 152 may also be referred to as "masking."

Prior to running simulation 118, icons 136, waypoints 137, and icons 138 may be placed onto electronic map 120. During simulation 118, icons 136 automatically move as a function of time. Icons 136 move between waypoints 137. Movement 153 of icons 136 during simulation may be affected by properties 140 of icons 136, as well as properties 144 of waypoints 137. Icons 138 may remain stationary. However, by using masks 152 during simulation 118, icons 138 appear to leave a first respective waypoint and appear at a second respective waypoint as if carried by an icon of icons 136.

User interface 119 may be used to input specifications for objects 135 for simulation 118. Software associated with electronic map 120 and second entity 123 may be used to move icons 136 in simulation 118. By superimposing functions of user interface 119 over electronic map 120, simulation 118 may be run with at least one of less time or less cost than programming an independent map for simulation 118.

As described above, movement 153 on electronic map 120 of icons 136 is performed by the software supporting electronic map 120. Movement 153 is performed based on latitude 154, longitude 155, and time 156. For example, a first waypoint of waypoints 137 for a first icon of icons 136 may have a first latitude, a first longitude, and a first time. A second waypoint of waypoints 137 for the first icon of icons 136 has a second latitude, a second longitude, and a second time. The second time may be calculated based on the distance between the first waypoint and the second waypoint, as well as speed 141 of the first icon of icons 136.

Further, simulation 118 may be performed any desirable number of times. Simulation 118 may be run multiple times by continuing to use playback system 132. Further, the speed of simulation 118 may be changed using playback system 132. Simulation 118 may be modified at any time by adding, removing, or modifying any of icons 136, waypoints 137, or icons 138. For example, properties 140 of an icon of icons 136 may be modified by selecting the icon. Selecting the icon may be performed by clicking on the icon, tapping on the icon, or any other desirable method. After selecting the icon, a menu may be presented to modify, delete, or perform other actions on the icon. Further, any of icons 136, waypoints 137, or icons 138 may be moved on electronic map 120 by selecting and dragging the selected item.

Simulation 118 may be referred to as "instantaneous." Some conventional methods of creating electronic simulations may have a set-up phase, a period of waiting, and the simulation will eventually run. Simulation 118 may be created, modified, or run without undesirable delay.

After creating simulation 118, simulation 118 may be saved as one of plurality of scenario records 157. Plurality of scenario records 157 may be saved in any desirable format that may be readable in electronic map 120. In some illustrative examples, plurality of scenario records may be saved as standard KML 2.2 files. A KML 2.2 file may be readable in an Open Geospatial Consortium compliant 134 geographic information system. Any of plurality of scenario records 157 may be replayed using buttons 126 of user interface 119. Specifically, any of plurality of scenario records 157 may be selected from scenarios 131.

The identity of input system 113 may affect how simulation 118 is performed. For example, when input system 113 is mouse 114 or keyboard 117, positions for icons 138 may be selected from drop down menu 125. Each location for icons 138 may be more precise using drop down menu 125 than by tapping or clicking on a location on electronic map 120. For example, using drop down menu 125, Washington D.C. may be selected for a location for an icon of icons 138. Using touchscreen 116, McLean, Va., which is nearly eleven miles from Washington D.C., may be selected instead for a location for an icon of icons 138.

In some illustrative examples, modifications 158 may be implemented to compensate for small differences in locations for icons 138. Modifications 158 may include a variety of rules. For example, modifications 158 may determine if icons 138 of the same type are positioned within a pre-set distance from each other. If icons 138 of the same type are positioned within a pre-set distance from each other, these may be treated as in the same location. For example, if 10 troops are dropped off in Queens, N.Y., and 5 troops are taken from Manhattan, N.Y., these troops may be treated as the same troops if Queens and Manhattan are a pre-set distance or less from each other. Queens and Manhattan are about 14 miles apart. If the pre-set distance is 10 miles, the 10 troops and 5 troops will be treated as different payloads 148. If the pre-set distance is 14 miles or more, the 5 troops will be treated as a subset of the 10 troops.

In some illustrative examples, metrics 159 may be displayed after simulation 118. Metrics 159 may include results obtained from simulation 118. Metrics 159 may include at least one of total flight hours, total mission calendar time, total distance, or any other desirable measurement. In some illustrative examples, metrics 159 may be used to evaluate different options for transportation entities. For example, simulation 118 may be run with a first transportation entity. The icon for the first transportation entity may be deleted and replaced by an icon for a second transportation entity. Simulation 118 may then be run with the second transportation entity. Metrics 159 from the first run of simulation 118 may then be compared to metrics 159 from the second run of simulation 118 to determine which of the first transportation entity or the second transportation entity has the more desirable performance.

In some illustrative examples, metrics 159 may be used to evaluate different options for waypoints. Similar to the example described for transportation entities above, simulation 118 may be run multiple times with different waypoints to evaluate the waypoints using metrics 159.

If simulation 118 is performed using KML, algorithm 160 may be used to simulate movement of icons 138. Specifically, KML does not have the ability to pick up, carry, or drop off objects. To simulate picking up or dropping off icons 138, algorithm 160 is used.

Algorithm 160 may first collect all payloads 148 with their properties 149, methods, and locations. The methods may include whether they are "picked up" or "dropped off." The locations may be at least some of waypoints 137.

Algorithm 160 may then sort payloads 148 in a table by locations and type. The type may include an identity of payloads 148, for instance cargo, fuel, or troops. Payloads 148 may then be grouped by the same identity of payloads 148, longitude 155, and latitude 154.

Algorithm 160 may then sort within each group by time. Algorithm 160 may then work backwards in time from the end to the beginning. For each event, if it is a "drop off,"

algorithm 160 sets visibility to "on" and turns visibility to "off" at the end of the simulation. For each event, if it is a "pick up," algorithm 160 goes back in time to see if there is an earlier "drop off." If there is an earlier "drop off" of sufficient quantity, algorithm 160 sets visibility to "on" at its drop off time and "off" at the pickup time.

If there is an earlier "drop off" of insufficient quantity, algorithm 160 sets the earlier "drop off" visibility to "on" at its drop off time and "off" at the pickup time. Further, algorithm 160 prepositions additional payload at the waypoint at the beginning of the simulation, and the visibility is set to "off" at the pickup time.

If there is no earlier "drop off", algorithm 160 prepositions sufficient payload at the waypoint at the beginning of the simulation, and the visibility is set to "off" at the pickup time. Algorithm 160 repeats this process for each type of payload of payloads 148 at each waypoint of waypoints 137. For example, algorithm 160 may perform this process for all troops at a first waypoint. Algorithm 160 may then perform this process for each type of cargo at the first waypoint. Algorithm 160 may then move on to a second waypoint and address each type of payload individually.

Although not previously discussed, icons 136 may travel along number of routes 161. Waypoints 137 may form number of routes 161 for icons 136 to travel along. Icons 136 may move along number of routes 161 formed by waypoints 137.

The illustration of simulation environment 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, in addition to the depicted components of user interface 119, a ferry editor may be present. A ferry editor may create a movement for one of icons 136 between two locations multiple times without having to drop multiple waypoints on top of each other. In this way, an icon of icons 136 may move back and forth between a first waypoint and a second waypoint of waypoints 137 multiple times without having to place waypoints on top of each other. Use of a ferry editor may also reduce at least one of the amount of time to set-up movement 153 of the icon of icons 136 or the input to set-up movement 153 of the icon.

Figure 2:
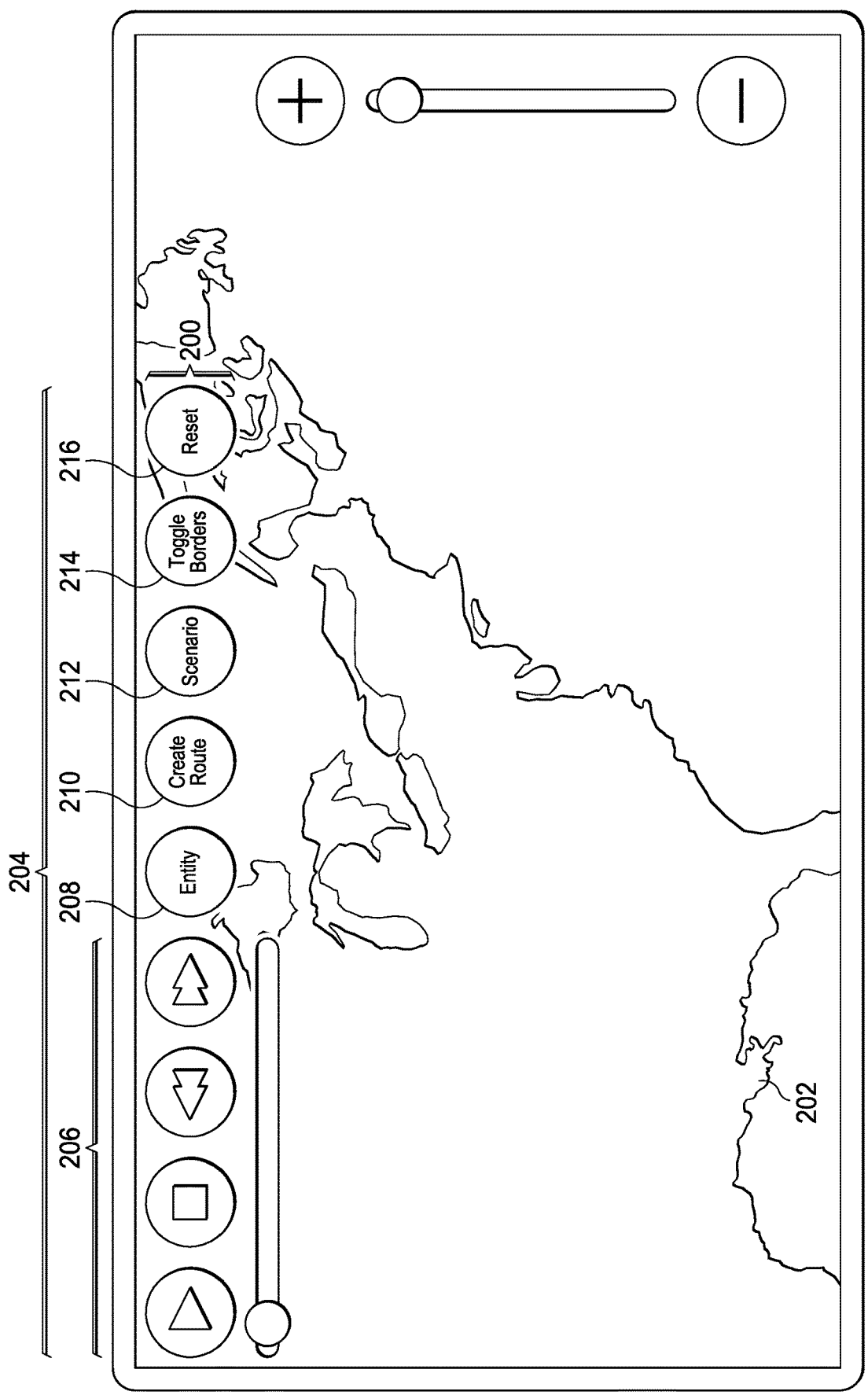
FIG. 2 is an illustration of a graphical user interface superimposed over an electronic map in accordance with an illustrative embodiment.

Turning now to FIG. 2, an illustration of a graphical user interface superimposed over an electronic map is depicted in accordance with an illustrative embodiment. Graphical user interface 200 may be an implementation of user interface 119 of FIG. 1. Electronic map 202 may be an implementation of electronic map 120 of FIG. 1.

As depicted, graphical user interface 200 includes buttons 204. Buttons 204 include playback system 206, entity 208, create route 210, scenario 212, toggle borders 214, and reset 216. Toggle borders 214 may display labels on electronic map 202. The labels may include city names, state names, country names, borders, or any other desirable label. Reset 216 may be used to remove all objects from electronic map 202. As depicted, no objects are currently present on electronic map 202.

Figure 3:
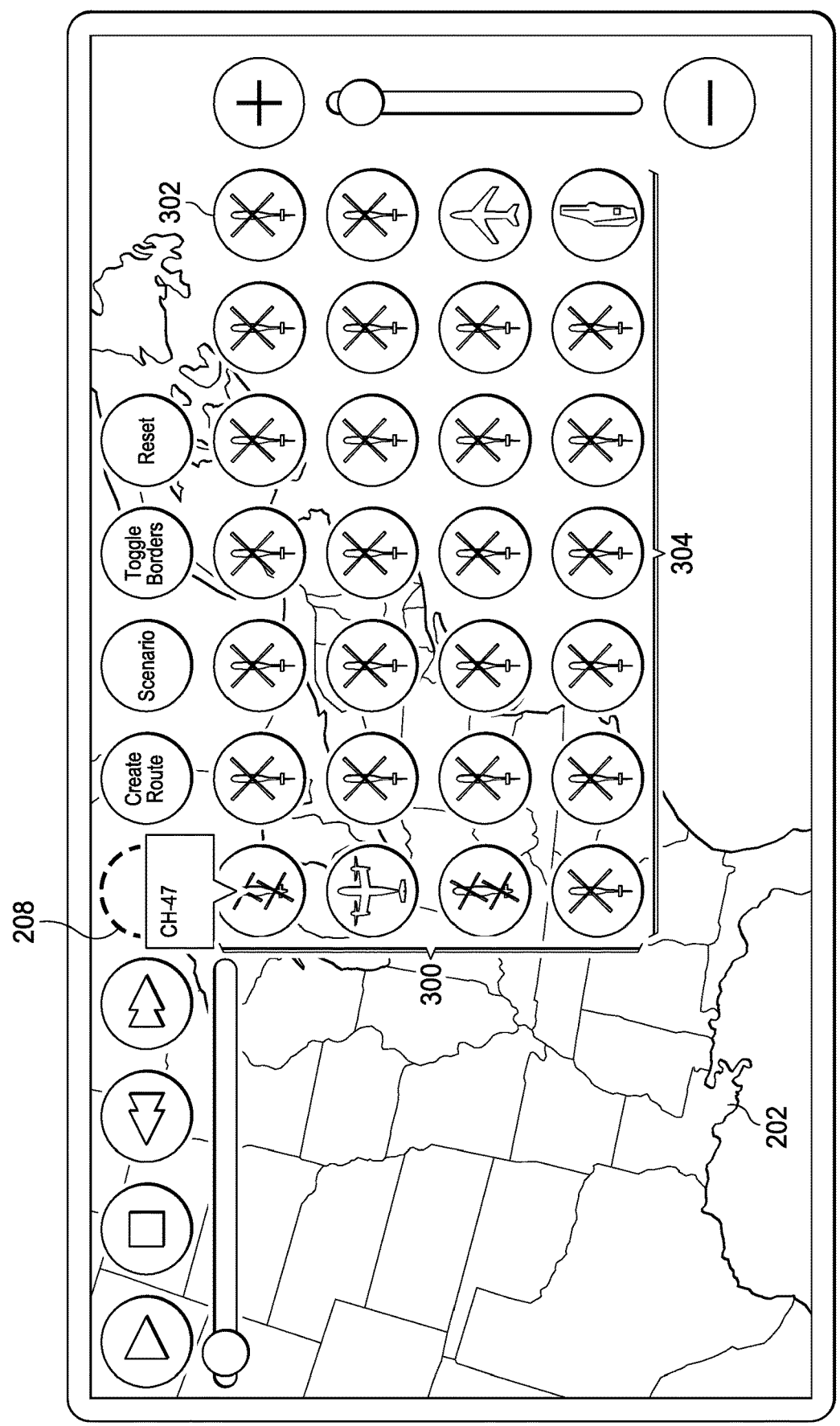
FIG. 3 is an illustration of an array of transportation entities over an electronic map in accordance with an illustrative embodiment.

Turning now to FIG. 3, an illustration of an array of transportation entities over an electronic map is depicted in accordance with an illustrative embodiment. As depicted, array 300 of icons 302 is depicted. Array 300 of icons 302 is drop down menu 304 of graphical user interface 200. Array 300 may be displayed by toggling entity 208. An icon representing a transportation entity may be selected from array 300. After selecting an icon, that icon may be positioned on electronic map 202 by selecting a location of electronic map 202.

Figure 4:
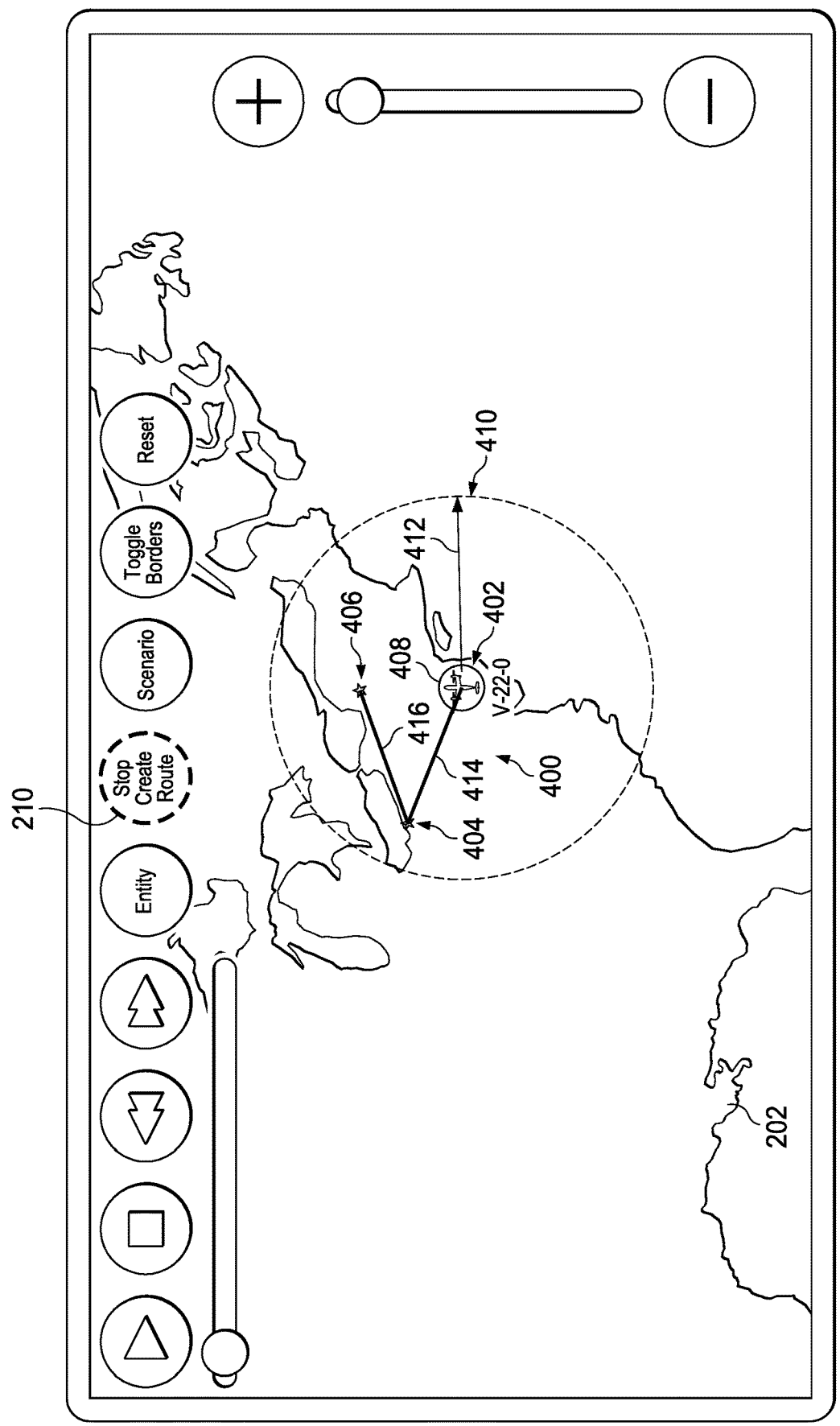
FIG. 4 is an illustration of a number of waypoints and an icon on an electronic map in accordance with an illustrative embodiment.

Turning now to FIG. 4, an illustration of a number of waypoints and an icon on an electronic map is depicted in accordance with an illustrative embodiment. As depicted, create route 210 is toggled to place waypoints 400 on electronic map 202. To stop placing waypoints on electronic map 202, create route 210 is toggled again.

Waypoints 400 include waypoint 402, waypoint 404, and waypoint 406. Icon 408 is present at waypoint 402. As depicted, icon 408 represents a V-22 Osprey. Ring 410 may represent a range or a radius for icon 408. When ring 410 represents a range for icon 408, radius 412 of ring 410 may be the distance the transportation entity, represented by icon 408, may travel before refueling. When ring 410 represents a radius for icon 408, radius 412 of ring 410 may be the distance the transportation entity can travel to and then return to waypoint 402 without refueling. In this example, radius 412 may be half the distance the transportation entity can travel without refueling. At least one of the size, the image, or the range of icon 408 may be changed by changing the transportation entity.

Route 414 is formed by connecting waypoints 400 by lines 416. During a simulation, icon 408 will automatically move from waypoint 402 to waypoint 404 and then to waypoint 406.

Figure 5:
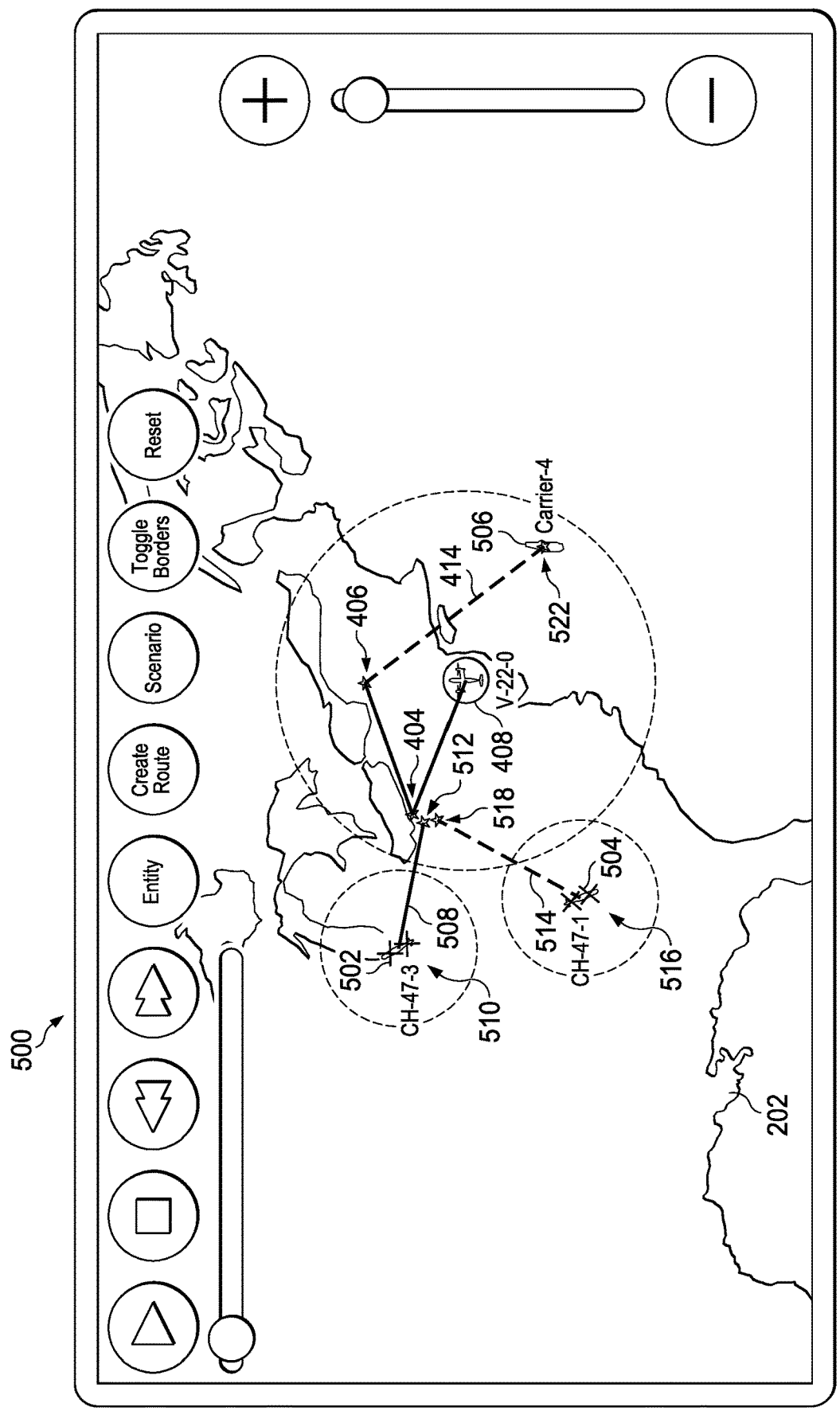
FIG. 5 is an illustration of a plurality of waypoints and a plurality of icons in accordance with an illustrative embodiment.

Turning now to FIG. 5, an illustration of a plurality of waypoints and a plurality of icons is depicted in accordance with an illustrative embodiment. In view 500, icon 502, icon 504, and icon 506 have been added to electronic map 202. Icon 502 has route 508, including waypoint 510 and waypoint 512. As indicated by at least one of the style or color of route 508, icon 502 may travel route 508 without refueling. Icon 504 has route 514, including waypoint 516 and waypoint 518. As indicated by at least one of the style or color of route 514, icon 504 may not travel route 514 without refueling. In this illustrative example, route 414 also includes waypoint 522. In this illustrative example, icon 408 may land on icon 506 at waypoint 522. However, the style or color of route 414 between waypoint 406 and waypoint 522 may indicate icon 408 cannot travel from waypoint 406 to waypoint 522 without refueling.

As depicted, icon 502 and icon 504 represent air vehicles. Icon 506 represents a water vehicle. Each of icon 502 and icon 504 have respective rings demonstrating a respective range.

As depicted, waypoint 404, waypoint 512, and waypoint 518 are near each other. In some illustrations, if modifications are used, payloads at at least one of waypoint 404, waypoint 512, or waypoint 518 may be treated as payloads at the same location as one of the other two of waypoint 404, waypoint 512, and waypoint 518.

Figure 6:
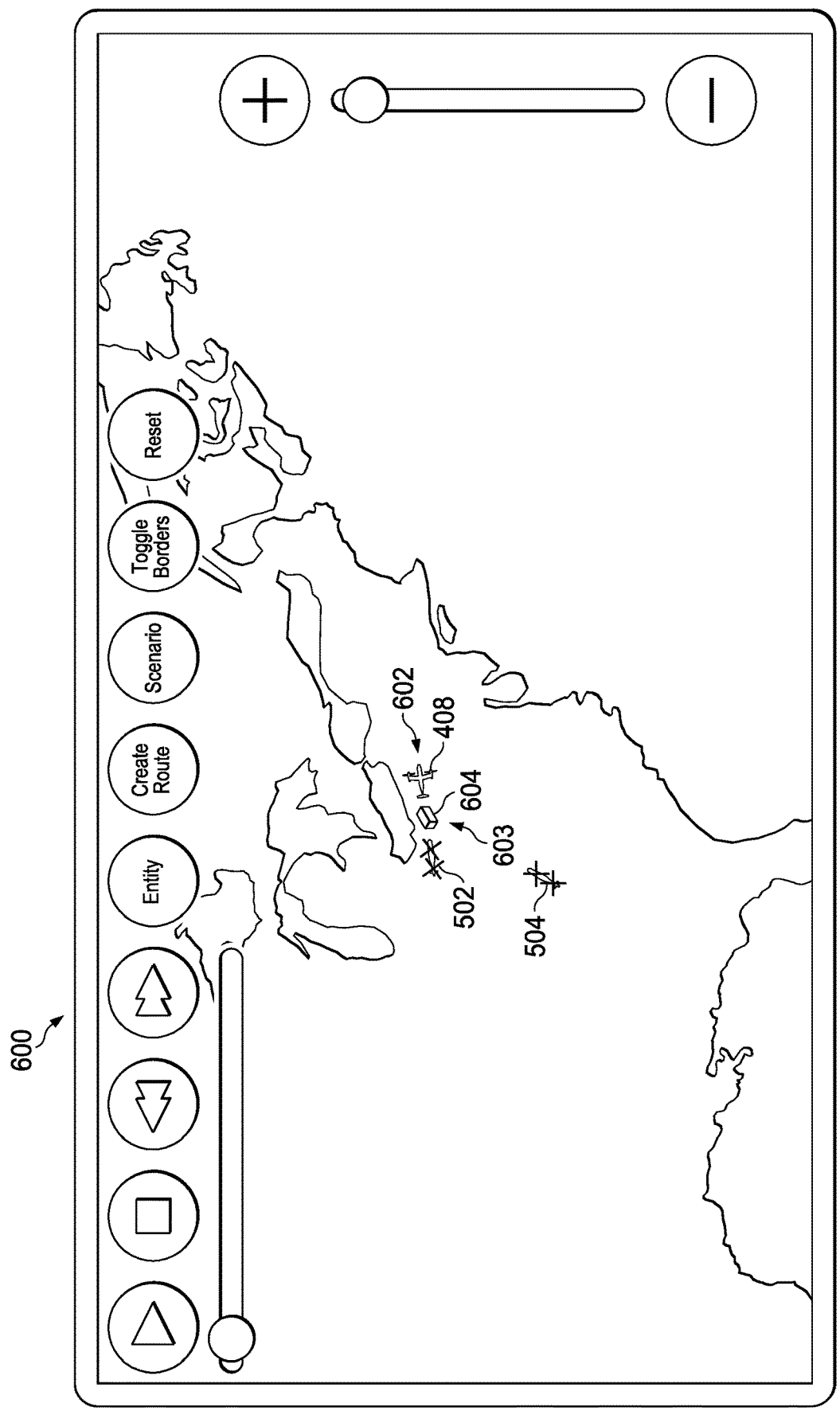
FIG. 6 is an illustration of a plurality of icons and a payload during a simulation in accordance with an illustrative embodiment.

Turning now to FIG. 6, an illustration of a plurality of icons and a payload during a simulation is depicted in accordance with an illustrative embodiment. View 600 is a view of electronic map 202 and graphical user interface 200 during a simulation such as simulation 118 of FIG. 1.

As depicted in view 600, each waypoint, route, and ring of FIGS. 4 and 5 are not shown during the simulation. For example, none of waypoint 402, waypoint 404, or waypoint 406 are shown in view 600. Nevertheless, based on location 602 of icon 408 on electronic map 202, it can be seen that icon 408 has already traveled to waypoint 404 and is now traveling towards waypoint 406. Each of icon 502 and icon 504 have moved along their respective routes towards waypoint 404.

Further, in view 600, payload 603 is positioned at waypoint 404 on electronic map 202. In this illustrative example, payload 603 takes the form of cargo 604. In view 600, it appears icon 408 deposited cargo 604 at waypoint 404. In view 500, cargo 604 may have been concealed by a mask.

The size of cargo 604 may be affected by the quantity of cargo 604. For example, if the quantity of cargo 604 were reduced, cargo 604 may be smaller on electronic map 202.

Figure 7:
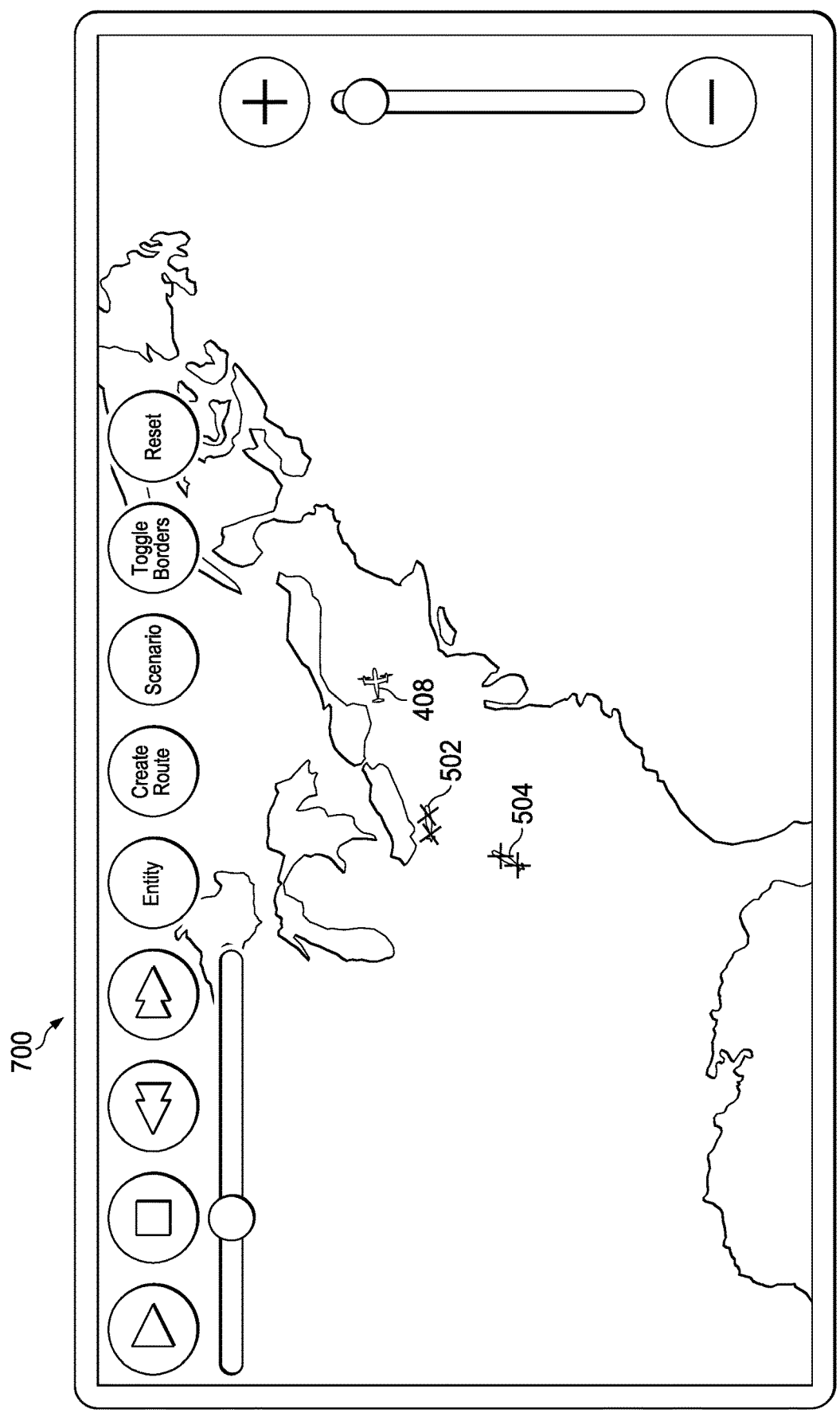
FIG. 7 is an illustration of a plurality of icons during a simulation in accordance with an illustrative embodiment.

Turning now to FIG. 7, an illustration of a plurality of icons during a simulation is depicted in accordance with an illustrative embodiment. In view 700, icon 408, icon 502, and icon 504 have moved relative to view 600. In view 700, icon 502 has reached waypoint 512. In this illustrative example, modifications have been made relative to waypoint 512 and waypoint 404. As a result, waypoint 512 and waypoint 404 may be treated as the same location for payloads.

In this illustrative example, icon 502 appears to "pick up" cargo 604. As a result, cargo 604 is no longer visible in view 700. Cargo 604 is concealed by a mask in view 700.

In some illustrative examples, icon 502 may appear to "pick up" only a fraction of cargo 604. If icon 502 appeared to only "pick up" a fraction of cargo 604, an icon for cargo 604 would remain in view 700. However, the icon for cargo 604 may be smaller to indicate a smaller quantity. In this illustrative example, the larger icon would be concealed with a mask, while a mask was removed from a smaller cargo icon.

Figure 8:
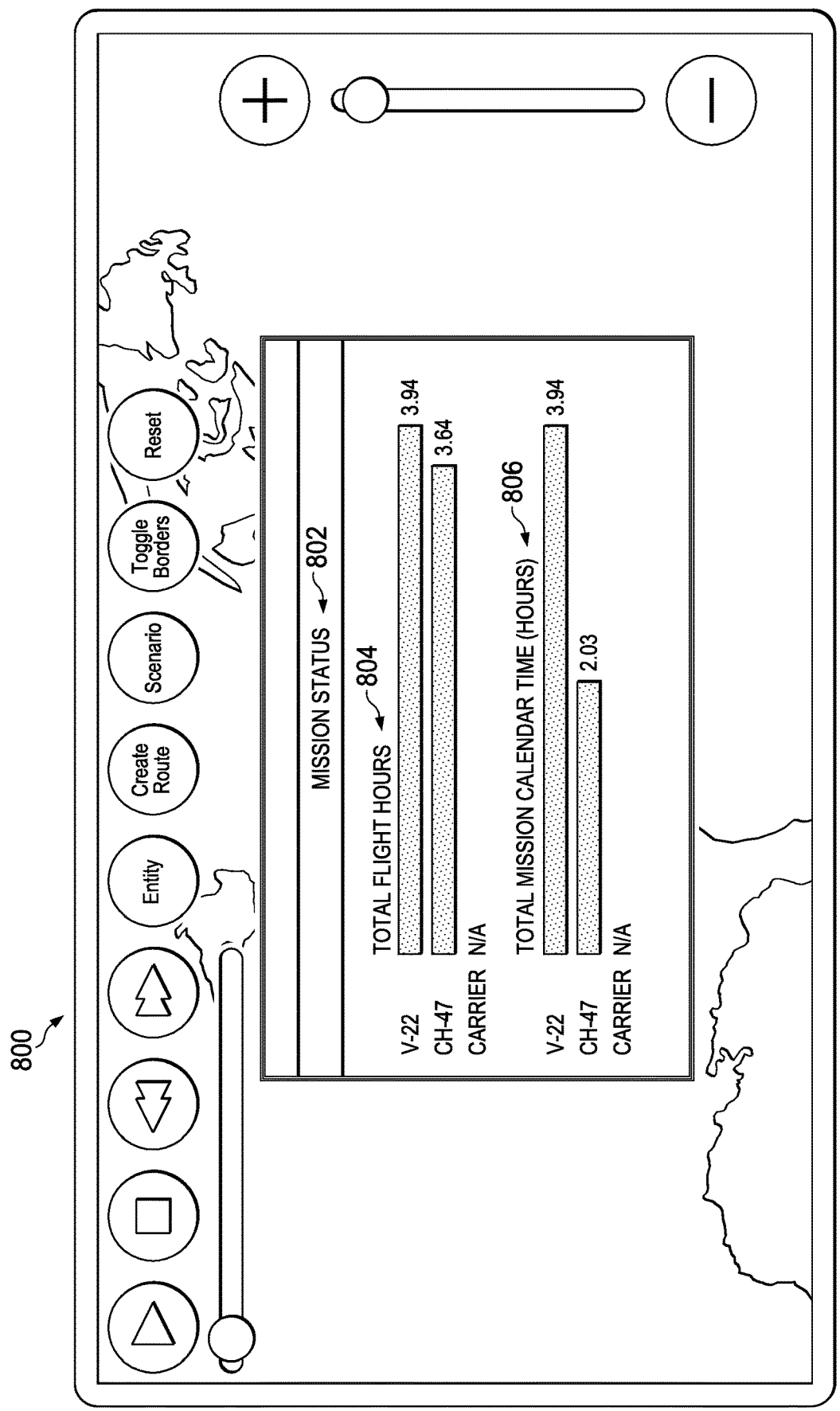
FIG. 8 is an illustration of an electronic map with mission data in accordance with an illustrative embodiment.

Turning now to FIG. 8, an illustration of an electronic map with mission data is depicted in accordance with an illustrative embodiment. In view 800, mission status 802 is displayed over electronic map 202. As depicted, mission status 802 includes total flight hours 804 and total mission calendar time 806. As depicted, the carrier represented by icon 506 in FIG. 5 does not have mission status data.

Mission status 802 may be used to evaluate the mission represented by the situation. Mission status may be used to compare missions with different transportation entities or different waypoints.

Figure 9:
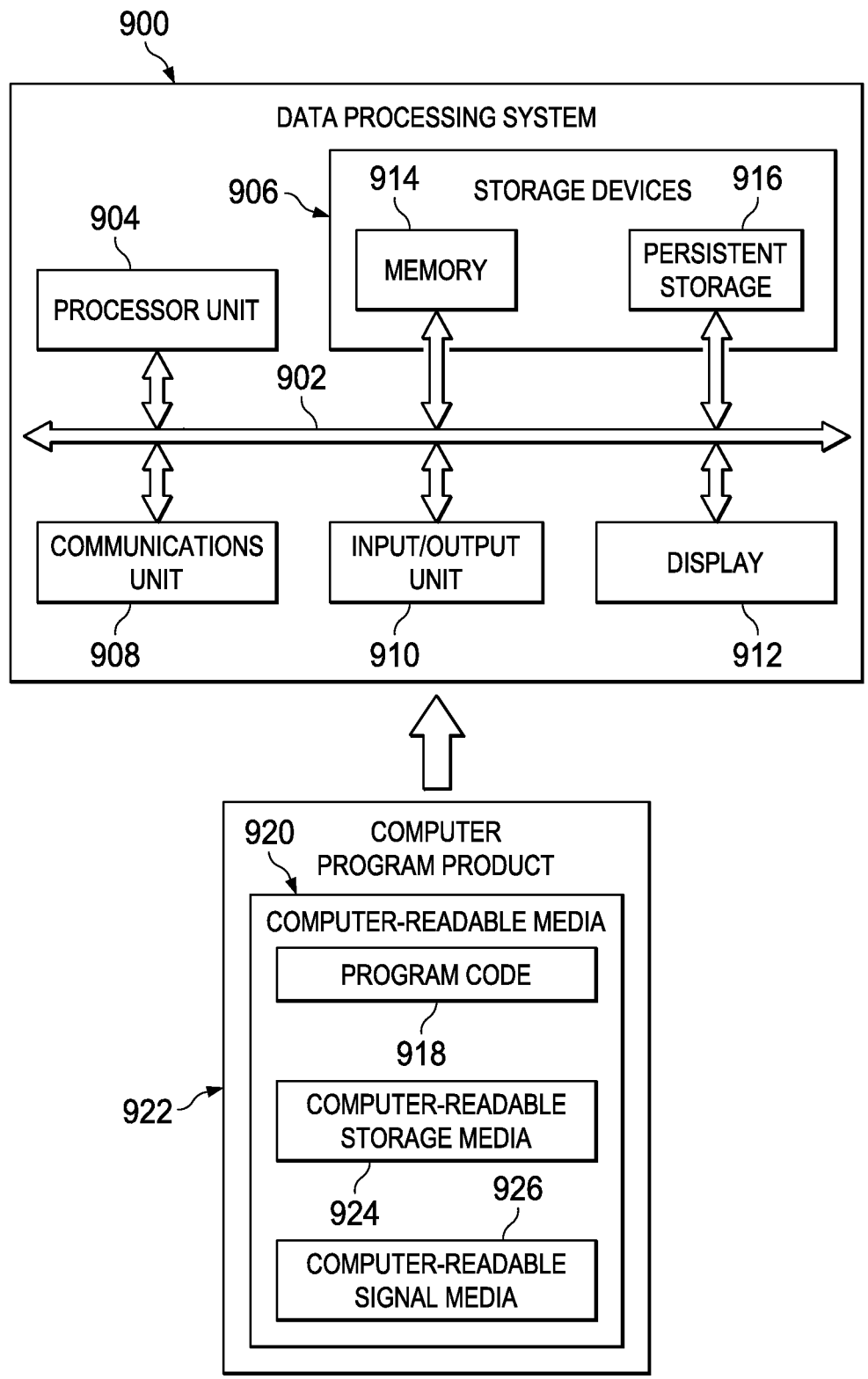
FIG. 9 is an illustration of a block diagram of a data processing system in accordance with an illustrative embodiment.

Turning now to FIG. 9, an illustration of a block diagram of a data processing system is depicted in accordance with an illustrative embodiment. Data processing system 900 may be used to implement computer system 111 in FIG. 1. As depicted, data processing system 900 includes communications framework 902, which provides communications between processor unit 904, storage devices 906, communications unit 908, input/output unit 910, and display 912. In some cases, communications framework 902 may be implemented as a bus system.

Processor unit 904 is configured to execute instructions for software to perform a number of operations. Processor unit 904 may comprise a number of processors, a multi-processor core, and/or some other type of processor, depending on the implementation. In some cases, processor unit 904 may take the form of a hardware unit, such as a circuit system, an application-specific integrated circuit (ASIC), a programmable logic device, or some other suitable type of hardware unit.

Instructions for the operating system, applications, and/or programs run by processor unit 904 may be located in storage devices 906. Storage devices 906 may be in communication with processor unit 904 through communications framework 902. As used herein, a storage device, also referred to as a computer-readable storage device, is any piece of hardware capable of storing information on a temporary and/or permanent basis. This information may include, but is not limited to, data, program code, and/or other information.

Memory 914 and persistent storage 916 are examples of storage devices 906. Memory 914 may take the form of, for example, a random access memory or some type of volatile or non-volatile storage device. Persistent storage 916 may comprise any number of components or devices. For example, persistent storage 916 may comprise a hard drive, a flash memory, a rewritable optical disk, a rewritable magnetic tape, or some combination of the above. The media used by persistent storage 916 may or may not be removable.

Communications unit 908 allows data processing system 900 to communicate with other data processing systems and/or devices. Communications unit 908 may provide communications using physical and/or wireless communications links.

Input/output unit 910 allows input to be received from and output to be sent to other devices connected to data processing system 900. For example, input/output unit 910 may allow user input to be received through a keyboard, a mouse, and/or some other type of input device. As another example, input/output unit 910 may allow output to be sent to a printer connected to data processing system 900.

Display 912 is configured to display information to a user. Display 912 may comprise, for example, without limitation, a monitor, a touch screen, a laser display, a holographic display, a virtual display device, and/or some other type of display device.

In this illustrative example, the processes of the different illustrative embodiments may be performed by processor unit 904 using computer-implemented instructions. These instructions may be referred to as program code, computer-usable program code, or computer-readable program code, and may be read and executed by one or more processors in processor unit 904.

In these examples, program code 918 is located in a functional form on computer-readable media 920, which is selectively removable, and may be loaded onto or transferred to data processing system 900 for execution by processor unit 904. Program code 918 and computer-readable media 920 together form computer program product 922. In this illustrative example, computer-readable media 920 may be computer-readable storage media 924 or computer-readable signal media 926.

Computer-readable storage media 924 is a physical or tangible storage device used to store program code 918, rather than a medium that propagates or transmits program code 918. Computer-readable storage media 924 may be, for example, without limitation, an optical or magnetic disk or a persistent storage device that is connected to data processing system 900.

Alternatively, program code 918 may be transferred to data processing system 900 using computer-readable signal media 926. Computer-readable signal media 926 may be, for example, a propagated data signal containing program code 918. This data signal may be an electromagnetic signal, an optical signal, and/or some other type of signal that can be transmitted over physical and/or wireless communications links.

The illustration of data processing system 900 in FIG. 9 is not meant to provide architectural limitations to the manner in which the illustrative embodiments may be implemented. The different illustrative embodiments may be implemented in a data processing system that includes components in addition to or in place of those illustrated for data processing system 900. Further, components shown in FIG. 9 may be varied from the illustrative examples shown.

The different components shown in FIGS. 2-9 may be combined with components in FIG. 1, used with components in FIG. 1, or a combination of the two. Additionally, some of the components in FIGS. 2-9 may be illustrative examples of how components shown in block form in FIG. 1 can be implemented as physical structures.

Figure 10:
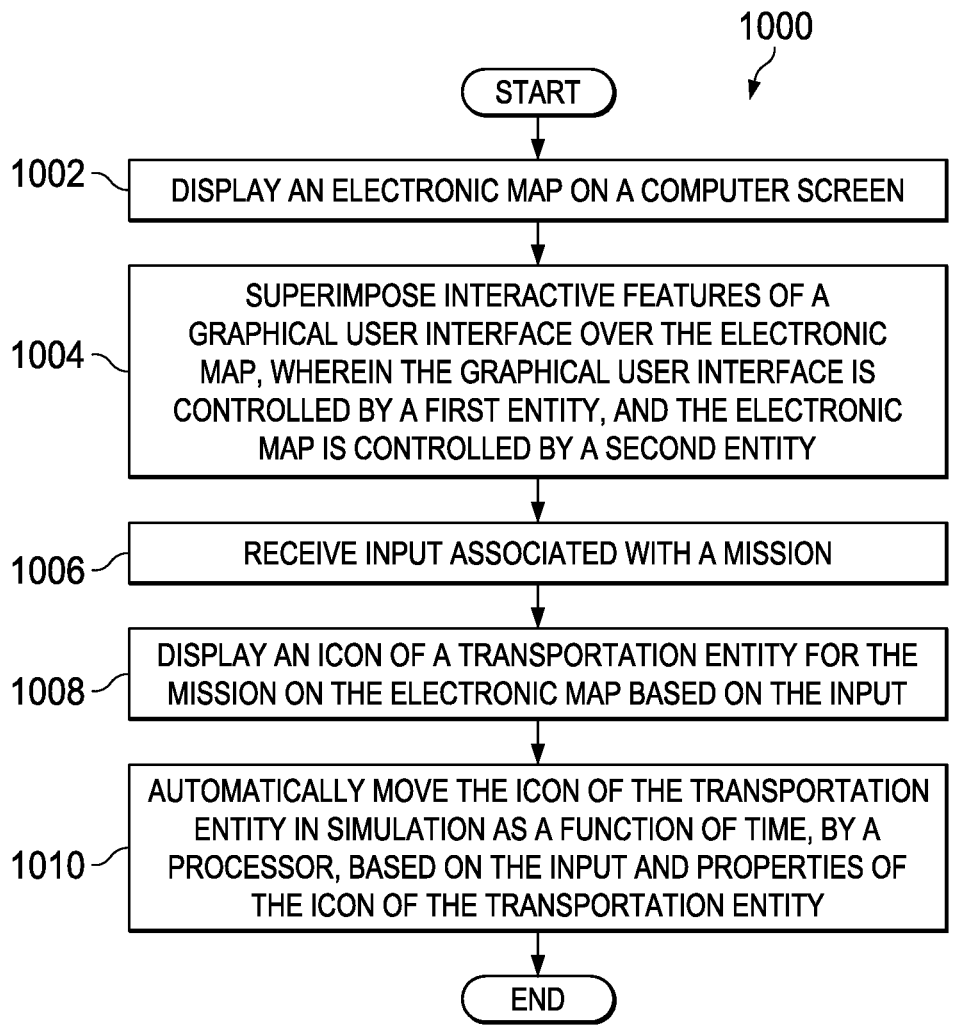
FIG. 10 is an illustration of a flowchart of a computer-implemented method in accordance with an illustrative embodiment.

Turning now to FIG. 10, an illustration of a flowchart of a computer-implemented method is depicted in accordance with an illustrative embodiment. Process 1000 may be a method employed in performing a simulation in FIGS. 6 and 7. Process 1000 may be a method of performing simulation 118 of FIG. 1.

Process 1000 begins by displaying an electronic map on a computer screen (operation 1002). In some illustrative examples, the electronic map is an Open Geospatial Consortium compliant geographic information system. Process 1000 then superimposes interactive features of a graphical user interface over the electronic map, wherein the graphical user interface is controlled by a first entity, and the electronic map is controlled by a second entity (operation 1004).

Process 1000 then receives input associated with a mission (operation 1006). Process 1000 then displays an icon of a transportation entity for the mission on the electronic map based on the input (operation 1008). In some illustrative examples, the icon of the transportation entity is selected using the interactive features of the graphical user interface. The icon of the transportation entity may be positioned on a location on the electronic map based on the input.

Process 1000 then automatically moves the icon of the transportation entity in simulation as a function of time, by a processor, based on the input and properties of the icon of the transportation entity (operation 1010). Afterwards, the process terminates. The properties of the icon of the transportation entity may include a speed. In these illustrative examples, automatically moving the icon of the transportation entity in simulation as a function of time map comprise moving the icon of the transportation entity between a first waypoint, represented by a first latitude, a first longitude, and a first time, and a second waypoint, represented by a second latitude, a second longitude, and a second time calculated using the speed.

Figure 11:
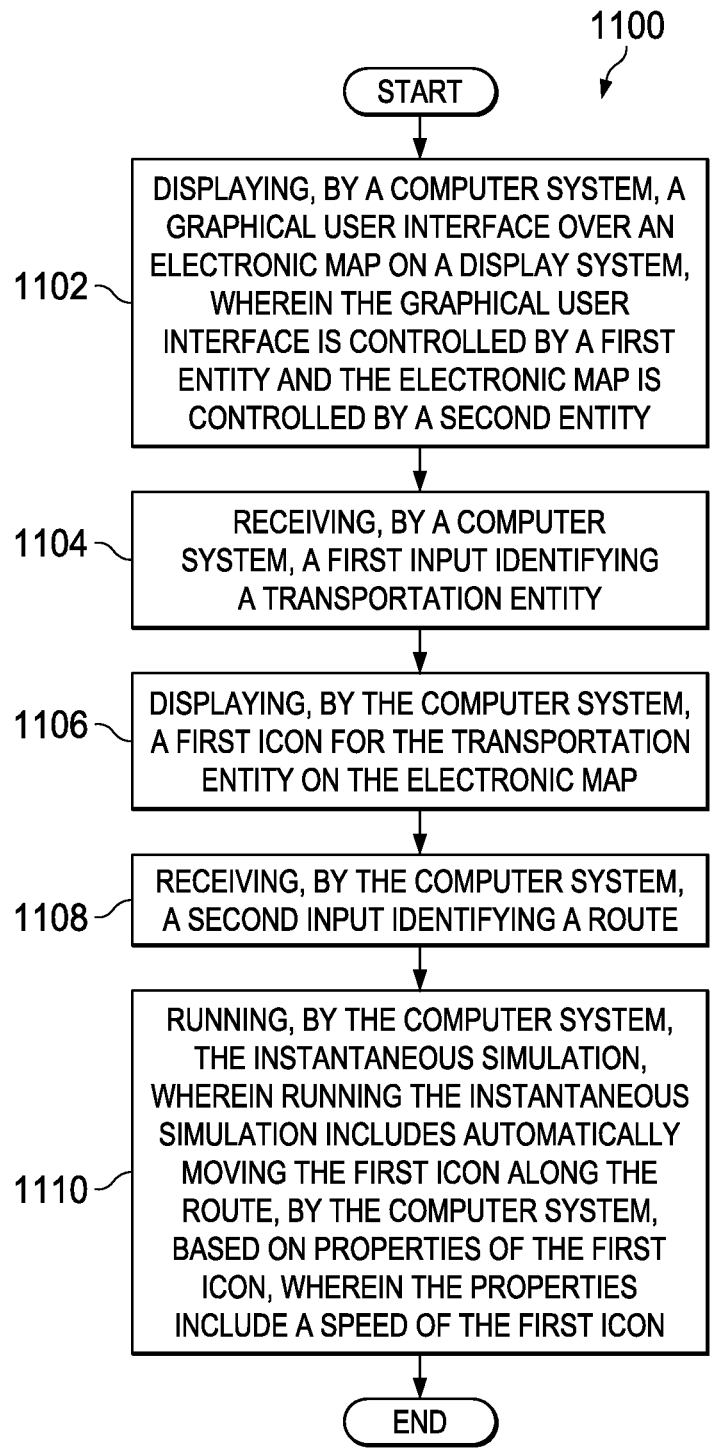
FIG. 11 is an illustration of a flowchart of a method for creating an instantaneous simulation in accordance with an illustrative embodiment.

Turning now to FIG. 11, an illustration of a flowchart of a method for creating an instantaneous simulation is depicted in accordance with an illustrative embodiment. Process 1100 may be a method employed in performing a simulation in FIGS. 6 and 7. Process 1100 may be a method of performing simulation 118 of FIG. 1.

Process 1100 begins by displaying, by a computer system, a graphical user interface over an electronic map on a display system (operation 1102). The graphical user interface is controlled by a first entity and the electronic map is controlled by a second entity. In some illustrative examples, the electronic map is an Open Geospatial Consortium compliant geographic information system.

Process 1100 then receives, by a computer system, a first input identifying a transportation entity (operation 1104). The transportation entity may be any desirable transportation entity, such as a land vehicle, an air vehicle, or a water vehicle. In some illustrative examples, the first input is received using the graphical user interface. For example, the first input may be a selection of an icon within an array of icons in the graphical user interface.

Process 1100 then displays, by the computer system, a first icon for the transportation entity on the electronic map (operation 1106). The first icon may be a pictorial representation of the transportation entity. For example, the first icon may resemble one of a helicopter, an airplane, a boat, a tank, a bus, or any other desirable vehicle. The size of the first icon may be related to an identity of the transportation entity. For example, smaller airplanes may have smaller icons than larger airplanes. As a result, the size of the first icon may be related to the identity of the transportation entity.

Process 1100 then receives, by the computer system, a second input identifying a route (operation 1108). In some illustrative examples, the second input is received on the electronic map. In one illustrative example, a first waypoint and a second waypoint may be clicked on the electronic map. This first waypoint and the second waypoint may form the route. In other illustrative examples, the route may be selected using the graphical user interface. For example, a first waypoint and a second waypoint may be selected from a drop down menu of the graphical user interface.

Process 1100 then runs, by the computer system, the instantaneous simulation (operation 1110). Running the instantaneous simulation includes automatically moving the first icon along the route, by the computer system, based on properties of the first icon. The properties include a speed of the first icon. Afterwards the process terminates.

Figure 12:
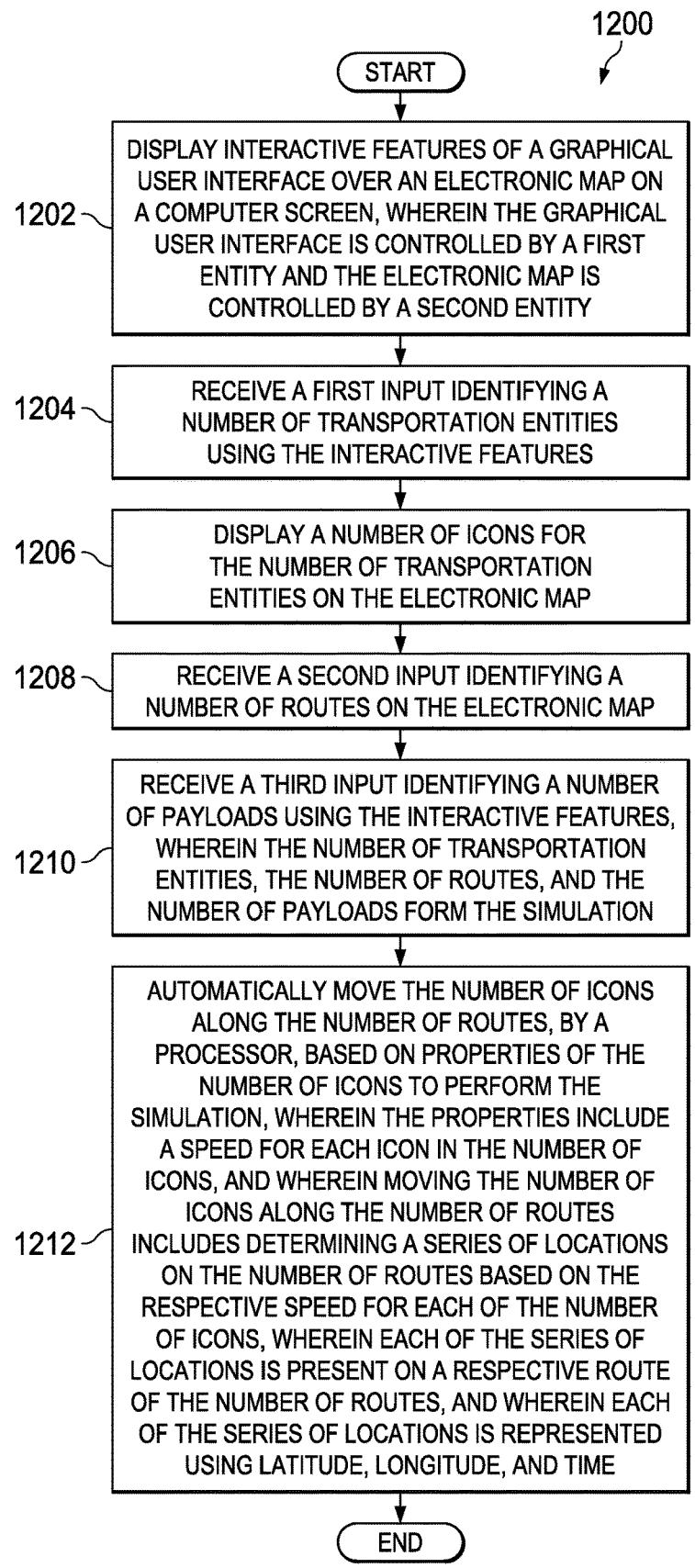
FIG. 12 is an illustration of a flowchart of a method for creating and performing a simulation in accordance with an illustrative embodiment.

Turning now to FIG. 12, an illustration of a flowchart of a method for creating and performing a simulation is depicted in accordance with an illustrative embodiment. Process 1200 may be a method employed in performing a simulation in FIGS. 6 and 7. Process 1200 may be a method of performing simulation 118 of FIG. 1.

Process 1200 begins by displaying interactive features of a graphical user interface over an electronic map on a computer screen (operation 1202). The graphical user interface is controlled by a first entity, and the electronic map is controlled by a second entity.

Process 1200 then receives a first input identifying a number of transportation entities using the interactive features (operation 1204). Process 1200 then displays a number of icons for the number of transportation entities on the electronic map (operation 1206).

Process 1200 then receives a second input identifying a number of routes on the electronic map (operation 1208). In some illustrative examples, the second input identifying the number of routes on the electronic map includes an interaction with the electronic map that adds a number of waypoints to form the number of routes.

Process 1200 then receives a third input identifying a number of payloads using the interactive features (operation 1210). The number of transportation entities, the number of routes, and the number of payloads form the simulation.

Process 1200 then automatically moves the number of icons along the number of routes, by a processor, based on properties of the number of icons to perform the simulation (operation 1212). The properties include a speed for each icon in the number of icons. Moving the number of icons along the number of routes includes determining a series of locations on the number of routes based on the respective speed for each of the number of icons. Each of the series of locations is present on a respective route of the number of routes. Each of the series of locations is represented using latitude, longitude, and time. Afterwards the process terminates.

In some illustrative examples, automatically moving the number of icons along the number of routes includes holding an icon of the number of icons at a waypoint for a specified period of time to simulate at least one of refueling, loading a payload, unloading a payload, or a scheduled delay.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the Figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Further, some blocks may not be implemented.

For example, process 1000 may further comprise displaying an icon of a payload for the mission on the electronic map. In some illustrative examples, process 1000 may also comprise masking the icon of the payload for the mission, such that the icon of the payload is not displayed on the map. In some illustrative examples, masking the icon of the payload occurs after moving the icon of the transportation entity.

As another example, process 1100 may further comprise selectively displaying a payload icon at a waypoint associated with the route as the first icon is moved along the route, such that the payload icon appears to be dropped off or picked up by the first icon. Selectively displaying the payload icon may comprise concealing, by the computer system, the payload icon using a mask.

In some illustrative examples, process 1100 may further comprise receiving, by the computer system, a third input identifying a second transportation entity using the graphical user interface; displaying, by the computer system, a second icon for the second transportation entity on the electronic map; and automatically moving the second icon, by the computer system, based on properties of the second icon while the first icon is automatically moved along the route, wherein properties of the second icon include a speed of the second icon. In some illustrative examples, the speed of the first icon is different from the speed of the second icon.

As yet a further example, process 1200 may further comprise displaying the number of payload icons at a number of waypoints on the number of routes; and selectively concealing the number of payload icons as the number of icons are automatically moved along the number of routes. Selectively concealing the number of payload icons may include adding and deleting a number of masks over the number of payload icons, wherein the number of payload icons are selectively concealed based on designated times. In some illustrative examples, displaying the number of payload icons at the number of waypoints on the number of routes and selectively concealing the number of payload icons as the number of icons are automatically moved along the number of routes causes a payload icon of the number of payload icons to appear to leave a first waypoint and appear at a second waypoint as if carried by an icon of the number of icons.

As a further example, process 1200 may further comprise receiving a fourth input on the electronic map to edit the number of routes to form a number of edited routes after automatically moving the number of icons along the number of routes; and automatically moving the number of icons along the number of edited routes, by a processor, based on properties of the number of icons to perform a second simulation. As another example, process 1200 may further comprise receiving a fourth input on the electronic map that moves, adds, or removes a waypoint from a route of the number of routes.

Thus, the illustrative embodiments provide a method and apparatus for performing an electronic training exercise. A simulation of a mission may be performed using an electronic map and a graphical user interface overlaying the electronic map. The electronic map may be an Open Geospatial Consortium compliant geographic information system. The graphical user interface is controlled by a first entity, while the electronic map is controlled and managed by a second entity. The first entity and second entity may be different companies, different departments, or different individuals. The second entity may provide the electronic map for a purpose other than a simulation of a mission. For example, the second entity may provide the electronic map for at least one of driving directions, images of locations, or geographical information.

The first entity may manage the options available in the graphical user interface. The first entity may reduce at least one of the time to produce a simulation or the cost to produce a simulation by not generating a dedicated map for the simulation. By using a map produced and controlled by a second entity, the first entity may not have to invest programming time or undesirable amounts of money. The first entity may take advantage of pre-existing geographical information and functionality in the electronic map.

Further, by providing the graphical user interface, a simulation may be superimposed over the electronic map. A simulation of the mission may not be performed solely using the electronic map. When using the graphical user interface and the electronic map in combination, a simulation of the mission may be performed.

Processing by the computer system may provide modifications to compensate for small differences in positions of waypoints. The modifications may allow waypoints within a designated distance to be effectively combined for payloads. The modifications may be a part of the graphical user interface.

Processing by the computer system may provide an algorithm to simulate addition and removal of payloads to the electronic map. This addition and removal of the payloads may represent the payloads being "picked up" or "dropped off" by transportation entities during the simulation. The algorithm may evaluate each waypoint and each type of payload to determine if the payload should be prepositioned at the waypoint. The algorithm may control when a payload is concealed using a mask during the simulation.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:
1. A computer-implemented method comprising:
displaying an electronic map on a computer screen;

superimposing interactive features of a graphical user interface over the electronic map, wherein the graphical user interface is controlled by a first entity, and the electronic map is controlled by a second entity;
receiving input associated with a mission;
displaying an icon of a transportation entity for the mission on the electronic map based on the input;
displaying an icon of a payload for the mission on the electronic map;
automatically moving the icon of the transportation entity across a portion of the electronic map in simulation as a function of time, by a processor, based on the input and properties of the icon of the transportation entity; and
masking the icon of the payload for the mission, based on said function of time, such that the icon of the payload is not displayed on the electronic map.

2. The computer-implemented method of claim 1, wherein the electronic map is an Open Geospatial Consortium compliant geographic information system.

3. The computer-implemented method of claim 1, wherein the icon of the transportation entity is positioned on a location on the electronic map based on the input.

4. The computer-implemented method of claim 1, wherein masking the icon of the payload occurs after moving the icon of the transportation entity.

5. The computer-implemented method of claim 1, wherein the properties of the icon of the transportation entity includes a speed, and wherein automatically moving the icon of the transportation entity in simulation as the function of time comprises moving the icon of the transportation entity between a first waypoint represented by a first latitude, a first longitude, and a first time, and a second waypoint represented by a second latitude, a second longitude, and a second time calculated using the speed.

6. The method of claim 1, wherein automatically moving the icon of the transportation entity in simulation as a function of time comprises automatically moving the icon of the transportation entity across at least a portion of the computer screen as the icon moves across the portion of the electronic map.

7. The method of claim 1, wherein the first entity is a first business or company and the second entity is a second business or company.

8. A method for creating an instantaneous simulation, the method comprising:
displaying, by a computer system, a graphical user interface over an electronic map on a display system, wherein the graphical user interface is controlled by a first entity, and the electronic map is controlled by a second entity;
receiving, by the computer system, a first input identifying a transportation entity;
displaying, by the computer system, a first icon for the transportation entity on the electronic map;
receiving, by the computer system, a second input identifying a route, the route including a first waypoint and a second waypoint; and
running, by the computer system, the instantaneous simulation, wherein running the instantaneous simulation includes automatically moving the first icon along the route, by the computer system, based on properties of the first icon, and selectively displaying a payload icon at a waypoint associated with the route as the first icon is moved along the route, such that the payload icon appears to be dropped off or picked up by the first icon, wherein the properties include a speed of the first icon,
wherein automatically moving the first icon comprises moving the first icon between the first waypoint, represented by a first latitude, a first longitude, and a first time, and the second waypoint, represented by a second latitude, a second longitude, and a second time calculated using the speed.

9. The method of claim 8, wherein:
the first input is received using the graphical user interface; and
the second input is received on the electronic map.

10. The method of claim 8, wherein selectively displaying the payload icon comprises:
concealing, by the computer system, the payload icon using a mask.

11. The method of claim 8 further comprising:
receiving, by the computer system, a third input identifying a second transportation entity using the graphical user interface;
displaying, by the computer system, a second icon for the second transportation entity on the electronic map; and
automatically moving the second icon, by the computer system, based on the properties of the second icon, while the first icon is automatically moved along the route, wherein the properties of the second icon include the speed of the second icon.

12. The method of claim 11, wherein the speed of the first icon is different from the speed of the second icon.

13. A method for creating and performing a simulation, the method comprising:
displaying interactive features of a graphical user interface over an electronic map on a computer screen, wherein the graphical user interface is controlled by a first entity, and the electronic map is controlled by a second entity;
receiving a first input identifying a number of transportation entities using the interactive features;
displaying a number of icons for the number of transportation entities on the electronic map;
receiving a second input identifying a number of routes on the electronic map;
receiving a third input identifying a number of payloads using the interactive features, wherein the number of transportation entities, the number of routes, and the number of payloads form the simulation; and
displaying a number of payload icons at a number of waypoints on the number of routes;
automatically moving the number of icons along the number of routes, by a processor, based on properties of the number of icons to perform the simulation, wherein the properties include a speed for each icon in the number of icons, and wherein moving the number of icons along the number of routes includes determining a series of locations on the number of routes based on the respective speed for each icon in the number of icons, wherein each of the series of locations is present on a respective route of the number of routes, and wherein each of the series of locations is represented using a latitude, a longitude, and a time; and
selectively concealing the number of payload icons as the number of icons are automatically moved along the number of routes.

14. The method of claim 13, wherein selectively concealing the number of payload icons includes adding and deleting a number of masks over the number of payload icons, and wherein the number of payload icons are selectively concealed based on designated times.

15. The method of claim 13, wherein automatically moving the number of icons along the number of routes includes holding the icon of the number of icons at a waypoint for a specified period of time to simulate at least one of refueling, loading a payload, unloading the payload, or a scheduled delay.

16. The method of claim 13 further comprising:
receiving a fourth input on the electronic map to edit the number of routes to form a number of edited routes after automatically moving the number of icons along the number of routes; and
automatically moving the number of icons along the number of edited routes, by the processor, based on the properties of the number of icons to perform a second simulation.

17. The method of claim 13 further comprising:
receiving a fourth input on the electronic map that moves, adds, or removes a waypoint from a route of the number of routes.

18. The method of claim 13, wherein the second input identifying the number of routes on the electronic map includes an interaction with the electronic map that adds a number of waypoints to form the number of routes.

19. The method of claim 13, wherein displaying the number of payload icons at the number of waypoints on the number of routes; and selectively concealing the number of payload icons as the number of icons are automatically moved along the number of routes causes a payload icon of the number of payload icons to appear to leave a first waypoint and appear at a second waypoint as if carried by the icon of the number of icons.

* * * * *